United States Patent
Hara et al.

(10) Patent No.: US 12,173,398 B2
(45) Date of Patent: Dec. 24, 2024

(54) CR—SI SINTERED BODY, SPUTTERING TARGET, AND METHOD FOR PRODUCING THIN FILM

(71) Applicant: TOSOH CORPORATION, Shunan (JP)

(72) Inventors: Hiroyuki Hara, Ayase (JP); Masami Mesuda, Ayase (JP); Ayaka Masuda, Ayase (JP)

(73) Assignee: TOSOH CORPORATION, Shunan (JP)

( * ) Notice: Subject to any disclaimer, the term of this patent is extended or adjusted under 35 U.S.C. 154(b) by 107 days.

(21) Appl. No.: 17/906,927

(22) PCT Filed: Mar. 24, 2021

(86) PCT No.: PCT/JP2021/012302
§ 371 (c)(1),
(2) Date: Sep. 21, 2022

(87) PCT Pub. No.: WO2021/193741
PCT Pub. Date: Sep. 30, 2021

(65) Prior Publication Data
US 2023/0121940 A1  Apr. 20, 2023

(30) Foreign Application Priority Data
Mar. 26, 2020  (JP) ................. 2020-055755

(51) Int. Cl.
*H01J 37/34* (2006.01)
*C23C 14/34* (2006.01)

(52) U.S. Cl.
CPC ...... *C23C 14/3414* (2013.01); *H01J 37/3426* (2013.01)

(58) Field of Classification Search
None
See application file for complete search history.

(56) References Cited

U.S. PATENT DOCUMENTS 5,409,517 A * 4/1995 Satou .................... C04B 35/645
75/950

FOREIGN PATENT DOCUMENTS

| EP | 1 118 690 A2 | 7/2001 |
| EP | 3 885 330 A1 | 9/2021 |
| JP | 8-20863 A | 1/1996 |
| JP | 2002-173765 A | 6/2002 |
| JP | 2003-167324 A | 6/2003 |
| JP | 2004-204278 A | 7/2004 |
| JP | 2013-502368 A | 1/2013 |
| JP | 2017-82314 A | 5/2017 |
| TW | 201734224 A | 10/2017 |
| WO | WO 2011/022058 A1 | 2/2011 |

OTHER PUBLICATIONS

International Preliminary Report on Patentability issued on Oct. 6, 2022 in PCT/JP2021/012302 filed on Mar. 24, 2021 (submitting English translation only), 5 pages.
Combined Taiwanese Office Action and Search Report issued Sep. 10, 2022, in corresponding Taiwanese Patent Application No. 110110897 (with English Translation of Category of Cited Documents), 5 pages.
Extended European Search Report issued Apr. 3, 2024 in European Patent Application No. 21777088.2, 8 pages.

* cited by examiner

*Primary Examiner* — Jason Berman
(74) *Attorney, Agent, or Firm* — Oblon, McClelland, Maier & Neustadt, L.L.P.

(57) ABSTRACT

A Cr—Si sintered body contains Cr and Si. The Cr—Si sintered body contains a crystalline $CrSi_2$ phase and a crystalline Si phase. A content of the Si phase in the Cr—Si sintered body is 40% by mass or more. A relative density of the Cr—Si sintered body relative to a true density of the Cr—Si sintered body is 95% or more. The $CrSi_2$ phase has an average crystal grain size of 40 μm or less, and the Si phase has an average crystal grain size of 30 μm or less. A total content of impurities in the Cr—Si sintered body is 200 ppm by mass or less, and the impurities are composed of at least one element selected from the group consisting of Mn, Fe, Mg, Ca, Sr, and Ba.

20 Claims, No Drawings

CR—SI SINTERED BODY, SPUTTERING TARGET, AND METHOD FOR PRODUCING THIN FILM

CROSS-REFERENCE TO RELATED APPLICATIONS

The present application is a 35 U.S.C. § 371 national stage patent application of International patent application PCT/JP2021/012302, filed on Mar. 24, 2021, which is based on and claims the benefits of priority to Japanese Application No. 2020-055755, filed on Mar. 26, 2020. The entire contents of these applications are incorporated herein by reference.

TECHNICAL FIELD

An aspect of the present invention relates to a Cr—Si sintered body used for, for example, forming a thin film, a sputtering target, and a method for producing a thin film.

BACKGROUND ART

In recent years, silicides such as $CrSi_2$ have been used as thin films in many technical fields such as semiconductors, solar cells, sensors for automobiles, and sensors for household electrical appliances because they have high resistivity (unit: $\Omega \cdot cm$) that is unlikely to change with temperature change. In the industrial production of thin films, a sputtering method is often used. However, in general, since compositions containing a silicide have low mechanical strength, sputtering targets containing a silicide are likely to crack in processing of the sputtering targets and discharging during the film formation. Thus, it is difficult to use, as sputtering targets, existing compositions containing a silicide. PTL 1 below discloses a method for producing, by a thermal spraying method, a sputtering target containing a crystal phase of chromium (Cr) and silicon (Si) for the purpose of improving mechanical strength of the sputtering target. However, in such a sputtering target produced by the thermal spraying method, mechanical strength is not sufficiently increased in a portion having a low Cr content. Furthermore, in the method described in PTL 1, since a sputtering target is produced by the thermal spraying method using a powder of a silicide, mechanical strength of the sputtering target is not sufficiently increased.

PTL 2 below discloses a method for producing, by a melting method, a composition having a fine eutectic structure containing Si and a silicide. However, in such a composition produced by the melting method, since the proportion of the eutectic structure is low, and a large amount of primary crystals are present, mechanical strength of the composition is not sufficiently increased. When the size of such a composition is increased, it becomes difficult to control the crystalline microstructure due to the difference in cooling rate in the composition, resulting in an increase in the unevenness of the mechanical strength in the composition.

PTL 3 and PTL 4 below also disclose sputtering targets containing silicides. However, PTL 3 does not describe the content of impurities in the sputtering target. PTL 4 describes the oxygen content and the carbon content in the sputtering target. PTL 4 describes a step of mechanically pulverizing a silicide powder in a process of producing the sputtering target. However, PTL 4 does not describe the content of metal impurities that deteriorate characteristics of semiconductor films.

CITATION LIST

Patent Literature

PTL 1: Japanese Unexamined Patent Publication No. 2017-82314
PTL 2: Japanese Unexamined Patent Publication No. 2013-502368
PTL 3: Japanese Unexamined Patent Publication No. 2002-173765
PTL 4: Japanese Unexamined Patent Publication No. 2003-167324

SUMMARY OF INVENTION

Technical Problem

An object of an aspect of the present invention is to provide a Cr—Si sintered body containing Cr and Si and having high mechanical strength, a sputtering target including the sintered body, and a method for producing a thin film using the sputtering target.

Solution to Problem

The inventors of the present invention have conducted extensive studies on a process of producing a Cr—Si sintered body constituted by a chromium silicide ($CrSi_2$) phase and a Si phase in the stoichiometric composition and containing the Si phase in a specific amount or more. As a result, the inventors of the present invention have found that a Cr—Si sintered body having high mechanical strength is obtained by using a rapidly quenched alloy powder such as a gas atomized powder and completed the present invention.

Specifically, a Cr—Si sintered body, a sputtering target, and a method for producing a thin film according to an aspect of the present invention are as follows.

(1) A Cr—Si sintered body containing chromium (Cr) and silicon (Si), in which a crystal structure determined by X-ray diffraction is constituted by a chromium silicide ($CrSi_2$) and silicon (Si), a Si phase is present in a bulk in an amount of 40% by mass or more, a sintered body density is 95% or more, a $CrSi_2$ phase has an average grain size of 40 µm or less, the Si phase has an average grain size of 30 pun or less, and a total amount of impurities of Mn+Fe+Mg+Ca+Sr+Ba is 200 ppm or less.

That is, a Cr—Si sintered body (sintered material) according to an aspect of the present invention is a Cr—Si sintered body containing Cr and Si, in which the Cr—Si sintered body contains a crystalline $CrSi_2$ phase and a crystalline Si phase, a content of the Si phase in the Cr—Si sintered body is 40% by mass or more, a relative density of the Cr—Si sintered body relative to a true density of the Cr—Si sintered body is 95% or more, the $CrSi_2$ phase has an average crystal grain size of 40 µm or less, the Si phase has an average crystal grain size of 30 µm or less, a total content of impurities in the Cr—Si sintered body is 200 ppm by mass or less, and the impurities are composed of at least one element selected from the group consisting of manganese (Mn), iron (Fe), magnesium (Mg), calcium (Ca), strontium (Sr), and barium (Ba).

(2) The Cr—Si sintered body according to (1), having a flexural strength of 100 MPa or more.

That is, a flexural strength of the Cr—Si sintered body according to an aspect of the present invention may be 100 MPa or more.

(3) The Cr—Si sintered body according to (1) or (2), in which an amount of oxygen in the bulk is 1% by mass or less.

That is, an oxygen content in the Cr—Si sintered body according to an aspect of the present invention may be 1% by mass or less.

(4) A sputtering target composed of the Cr—Si sintered body according to any one of (1) to (3).

That is, a sputtering target according to an aspect of the present invention includes the above Cr—Si sintered body.

(5) A method for producing a thin film, the method including sputtering using the sputtering target according to (4).

That is, a method for producing a thin film according to an aspect of the present invention includes a step of forming a thin film by sputtering using the above sputtering target.

Advantageous Effects of Invention

According to an aspect of the present invention, there are provided a Cr—Si sintered body containing Cr and Si and having high mechanical strength, a sputtering target including the sintered body, and a method for producing a thin film using the sputtering target.

DESCRIPTION OF EMBODIMENTS

Hereinafter, preferred embodiments of the present invention will be described. The present invention is not limited to the embodiments described below. The term "% by mass" below may also be referred to as % by weight (wt %). The term "Cr—Si sintered body" below may also be referred to as a bulk.

A Cr—Si sintered body according to the present embodiment contains Cr and Si. The Cr—Si sintered body contains a crystalline $CrSi_2$ phase and a crystalline Si phase. A content of the Si phase in the Cr—Si sintered body is 40% by mass or more. A relative density of the Cr—Si sintered body relative to a true density of the Cr—Si sintered body is 95% or more. The $CrSi_2$ phase has an average crystal grain size of 40 μm or less, and the Si phase has an average crystal grain size of 30 μm or less. A total content of impurities in the Cr—Si sintered body is 200 ppm by mass or less, and the impurities are composed of at least one element selected from the group consisting of Mn, Fe, Mg, Ca, Sr, and Ba.

A sputtering target according to this embodiment includes the above Cr—Si sintered body.

A method for producing a thin film according to an aspect of the present invention includes a step of forming a thin film by sputtering using the above sputtering target.

Since the Cr—Si sintered body according to this embodiment has good mechanical strength, the sputtering target according to this embodiment is unlikely to crack in sputtering at a high output power. Accordingly, the method for producing a thin film, the method including sputtering using the sputtering target according to this embodiment, can achieve high productivity.

Details of this Embodiment are as Follows

The $CrSi_2$ phase and the Si phase in the Cr—Si sintered body and crystal structures thereof may be detected and identified by X-ray diffractometry (XRD). The crystal structure of the $CrSi_2$ phase belongs to the hexagonal system. The crystal structure (diamond structure) of the Si phase belongs to the cubic system. The $CrSi_2$ phase and the Si phase may coexist in the Cr—Si sintered body. The $CrSi_2$ phase may include one or more crystal grains composed of $CrSi_2$. The Si phase may include one or more crystal grains composed of Si. The Cr—Si sintered body may be composed only of the $CrSi_2$ phase and the Si phase. When the Cr—Si sintered body is composed only of the $CrSi_2$ phase and the Si phase, the Cr—Si sintered body tends to have high mechanical strength. In the case where silicification reaction of Cr does not proceed sufficiently in the Cr—Si sintered body, and another silicide phase (such as $Cr_3Si$, $Cr_5Si_3$, or CrSi) that is not supposed to be present in the stoichiometric ratio and/or a chromium (Cr) phase is locally present in the Cr—Si sintered body, microcracks due to the difference in density in the Cr—Si sintered body are present inside the Cr—Si sintered body, in particular, a large Cr—Si sintered body is likely to crack, and it is difficult to produce such a Cr—Si sintered body at a high yield rate. Furthermore, when a high power is supplied to a sputtering target composed of a Cr—Si sintered body containing another silicide phase and/or a chromium phase, the Cr—Si sintered body is likely to crack during discharging, resulting in a decrease in productivity in a film formation step.

However, the Cr—Si sintered body may contain, in addition to the $CrSi_2$ phase and the Si phase, at least one of a small amount of another silicide phase and a small amount of a chromium phase as long as the Cr—Si sintered body has sufficiently high mechanical strength, and cracking of the sputtering target during sputtering is sufficiently suppressed.

The content of the Si phase in the Cr—Si sintered body is 40% by mass or more and 99% by mass or less. The content of the Si phase in the Cr—Si sintered body may be preferably 60% by mass or more and 99% by mass or less, more preferably 80% by mass or more and 99% by mass or less. As the content of the Si phase increases, the resistivity of the Cr—Si sintered body increases, and a thin film having a higher resistivity can be produced. For the same reason, the content of the Si phase in the Cr—Si sintered body may be 48.7% by mass or more and 62.6% by mass or less.

The content of the $CrSi_2$ phase in the Cr—Si sintered body may be 1% by mass or more and 60% by mass or less, preferably 1% by mass or more and 40% by mass or less, more preferably 1% by mass or more and 20% by mass or less. As the content of the $CrSi_2$ phase decreases, the resistivity of the Cr—Si sintered body increases, and a thin film having a higher resistivity can be produced. However, if the content of the $CrSi_2$ phase is excessively low, the Cr—Si sintered body is less likely to have a resistivity that is unlikely to change with temperature change. For the same reason, the content of the $CrSi_2$ phase in the Cr—Si sintered body may be 37.4% by mass or more and 51.3% by mass or less.

The relative density of the Cr—Si sintered body relative to the true density of the Cr—Si sintered body is 95% or more and 100% or less. If the relative density is lower than 95%, mechanical strength of the Cr—Si sintered body decreases. When abnormal electrical discharge (arching) occurs during film formation by sputtering, the surface of the sputtering target is melted or scattered, resulting in the generation of particle defects (particles) in the resulting thin film. The particle defects (particles) refer to coarse particles that are detached from the sputtering target without being vaporized during sputtering and attached to a thin film. The relative density of the Cr—Si sintered body may be preferably 97% or more and 100% or less, more preferably 98% or more and 100% or less because the frequency of generation of arching and particle defects (particles) tends to be reduced. For the same reason, the relative density of the Cr—Si sintered body may be 98.4% or more and 99.9% or less.

The average crystal grain size of the $CrSi_2$ phase is 1 μm or more and 40 μm or less. If the average crystal grain size of the $CrSi_2$ phase is more than 40 μm, the mechanical strength of the Cr—Si sintered body drastically decreases. The average crystal grain size of the $CrSi_2$ phase may be preferably 1 μm or more and 20 μm or less, more preferably 1 μm or more and 10 μm or less because high mechanical strength tends to be stably obtained. For the same reason, the average crystal grain size of the $CrSi_2$ phase may be 3 μm or more and 4 μm or less.

The average crystal grain size of the Si phase is 1 μm or more and 30 μm or less. If the average crystal grain size of the Si phase is more than 30 μm, the mechanical strength of the Cr—Si sintered body drastically decreases. The average crystal grain size of the Si phase may be preferably 1 or more and 20 μm or less, more preferably 1 μm or more and 10 μm or less because high mechanical strength tends to be stably obtained. For the same reason, the average crystal grain size of the Si phase may be 3 μm or more and 5 μm or less.

The average crystal grain size of each of the $CrSi_2$ phase and the Si phase may be measured in a backscattered electron image of a surface or a section of a polished Cr—Si sintered body. The backscattered electron image of the surface or the section of the Cr—Si sintered body may be taken with a scanning electron microscope (SEM). Crystal grains of the $CrSi_2$ phase and the Si phase in the backscattered electron image may be discriminated by the difference in crystal structure. The crystal structures and crystal orientations of crystal grains of the $CrSi_2$ phase and the Si phase may be specified on the basis of an electron backscatter diffraction (EBSD) pattern measured with a SEM. Crystal grains of the $CrSi_2$ phase and the Si phase in the backscattered electron image may be discriminated by the difference in composition (the presence or absence of Cr). The compositions of crystal grains of the $CrSi_2$ phase and the Si phase may be specified with an energy-dispersive X-ray spectrometer (EDS) attached to a SEM, or an electron probe micro analyzer (EPMA).

The crystal grain sizes of the $CrSi_2$ phase and the Si phase may be measured by a diameter measurement method. That is, the crystal grain size of the $CrSi_2$ phase may be the diameter of a circle having the same area as the sectional area (equivalent circle diameter) of one crystal grain of the $CrSi_2$ phase exposed on a surface or a section of the Cr—Si sintered body. The crystal grain size of the Si phase may be the diameter of a circle having the same area as the sectional area (equivalent circle diameter) of one crystal grain of the Si phase exposed on a surface or a section of the Cr—Si sintered body. The areas of the crystal grain sizes of the $CrSi_2$ phase and the Si phase may be measured using commercially available image analysis software.

The total of the sectional areas of crystal grains of the $CrSi_2$ phase in the backscattered electron image of the Cr—Si sintered body may be represented by s1. The true density of the $CrSi_2$ phase may be represented by d1. The total of the sectional areas of crystal grains of the Si phase in the backscattered electron image of the Cr—Si sintered body may be represented by s2. The true density of the Si phase may be represented by d2. The content (unit: % by mass) of the $CrSi_2$ phase in the Cr—Si sintered body may be substantially equal to $(d1 \times s1)/\{(d1 \times s1)+(d2 \times s2)\}$. The content (unit: % by mass) of the Si phase in the Cr—Si sintered body may be substantially equal to $(d2 \times s2)/\{(d1 \times s1)+(d2 \times s2)\}$. As described above, the content of the $CrSi_2$ phase and the content of the Si phase in the Cr—Si sintered body may be specified on the basis of the total of the sectional areas of crystal grains of the $CrSi_2$ phase and that of the Si phase, respectively.

The oxygen content in the Cr—Si sintered body may be 0% by mass or more and 1% by mass or less, preferably 0% by mass or more and 0.5% by mass or less, more preferably 0% by mass or more and 0.1% by mass or less, most preferably 0% by mass or more and 0.05% by mass or less because the generation of particle defects (particles) in a thin film tends to be suppressed, and the yield rate of the thin film increases. For the same reason, the oxygen content in the Cr—Si sintered body may be 0.02% by mass or more and 0.07% by mass or less.

The flexural strength of the Cr—Si sintered body may be preferably 100 MPa or more and 500 MPa or less, more preferably 150 MPa or more and 500 MPa or less, most preferably 200 MPa or more and 500 MPa or less. As the flexural strength of the Cr—Si sintered body increases, the Cr—Si sintered body is less likely to crack in steps of producing a sputtering target, such as grinding and bonding, the yield rate of the sputtering target increases, and productivity of the sputtering target is improved. Furthermore, in the case where the Cr—Si sintered body has high flexural strength, even if a high power is supplied to the sputtering target during sputtering, the sputtering target is unlikely to crack. For the same reason, the flexural strength of the Cr—Si sintered body may be 151 MPa or more and 291 MPa or less. The flexural strength of the Cr—Si sintered body is one of indicators indicating mechanical strength of the Cr—Si sintered body.

The total content of impurities in the Cr—Si sintered body is 0 ppm by mass or more and 200 ppm by mass or less, and the impurities are composed of at least one element selected from the group consisting of Mn, Fe, Mg, Ca, Sr, and Ba. That is, the total content of Mn, Fe, Mg, Ca, Sr, and Ba in the Cr—Si sintered body is 200 ppm by mass or less. When the total content of impurities is 200 ppm by mass or less, the Cr—Si sintered body has high mechanical strength, and the generation of particle defects (particles) in a thin film is sufficiently suppressed. For the same reason, the total content of the impurities in the Cr—Si sintered body may be preferably 0 ppm by mass or more and 100 ppm by mass or less, more preferably 0 ppm by mass or more and 50 ppm by mass or less. For the same reason, the total content of the impurities in the Cr—Si sintered body may be 19.78 ppm by mass or more and 31.00 ppm by mass or less.

The total content of Fe and Mn in the Cr—Si sintered body may be preferably 0 ppm by mass or more and 100 ppm by mass or less, more preferably 0 ppm by mass or more and 50 ppm by mass or less, or 19.29 ppm by mass or more and 30.49 pp by mass or less because the Cr—Si sintered body tends to have high mechanical strength, and the generation of particle defects (particles) in a thin film is likely to be suppressed.

The total content of Mg, Ca, Sr, and Ba in the Cr—Si sintered body may be preferably 0 ppm by mass or more and 3 ppm by mass or less, more preferably 0 ppm by mass or more and 2 ppm by mass or less, or 0.49 ppm by mass or more and 2.99 ppm by mass or less because the Cr—Si sintered body tends to have high mechanical strength, and the generation of particle defects (particles) in a thin film is likely to be suppressed.

Hereafter, a method for producing a Cr—Si sintered body according to the present embodiment will be described.

The method for producing a Cr—Si sintered body according to this embodiment includes (1) a step of preparing an alloy powder in which both a $CrSi_2$ phase and a Si phase are contained in one alloy particle; and (2) a step of sintering the alloy powder at a sintering temperature of 1,100° C. to 1,400° C. while a pressure of 50 MPa or less is applied to the alloy powder to obtain a Cr—Si sintered body.

Hereafter, each step of the method for producing a Cr—Si sintered body will be described.

(1) Alloy Powder Preparation Step

Pure chromium and pure silicon are used as raw materials of an alloy powder. The purity of each of the pure chromium and pure silicon is preferably 99.9% by mass or more, more preferably 99.99% by mass or more, most preferably 99.999% by mass or more. The preparation of the alloy powder from pure chromium and pure silicon with high purity enables the production of a Cr—Si sintered body having a total content of the impurities in the Cr—Si sintered body of 200 ppm by mass or less. Impurities in each raw material may cause abnormal grain growth in the sintering step. Furthermore, impurities in each raw material may be a source of the generation of particle defects (particles) during film formation by sputtering of the Cr—Si sintered body. The oxygen content in each raw material is preferably low. As the oxygen content in each raw material increases, the oxygen content in the Cr—Si sintered body increases, and particle defects (particles) are likely to be generated during film formation by sputtering. To produce a Cr—Si sintered body having a content of the Si phase of 40% by mass or more, the proportion of pure silicon in the raw materials of the alloy powder may be preferably 71% by mass or more and 99% by mass or less, or 75% by mass or more and 82% by mass or less. For the same reason, the proportion of pure chromium in the raw materials of the alloy powder may be preferably 1% by mass or more and 29% by mass or less, or 18% by mass or more and 25% by mass or less.

In the step of preparing an alloy powder, an alloy powder is produced through a step of rapidly cooling a liquid phase of an alloy containing chromium and silicon by a gas atomization method, a quenching roll (strip casting) method, an arc melting method, or the like. In particular, the alloy powder is preferably produced by a gas atomization method.

In the gas atomization method, a melt is obtained from pure chromium and pure silicon by high-frequency induction melting. The melt is dropped into a chamber filled with an inert gas. By blowing a high-pressure gas to the dropped melt, a large number of fine liquid droplets are formed from the melt, and the liquid droplets are each rapidly cooled in the chamber. As a result, an alloy powder including a fine crystalline microstructure is obtained. In particular, each alloy particle constituting the alloy powder formed by the gas atomization method is a substantially spherical particle having a diameter of about several tens of micrometers. In one alloy particle formed by the gas atomization method, fine crystal grains of the $CrSi_2$ phase having an average crystal grain size of 40 μm or less and the Si phase having an average crystal grain size of 30 μm or less are formed. Spherical alloy particles have a smaller specific surface area than alloy particles having another shape, and crystal grains in such spherical alloy particles are fine. As a result, oxidation of alloy particles is suppressed in the process of producing a Cr—Si sintered body, the oxygen content in the Cr—Si sintered body is reduced, and mechanical strength of the Cr—Si sintered body is increased. In the case of a Cr—Si sintered body produced by mixing and sintering fine particles smaller than the above spherical particles, the oxygen content increases, although the mechanical strength is high. In contrast, in the case of a Cr—Si sintered body produced by mixing and sintering coarse particles larger than the above spherical particles, the mechanical strength decreases, although the oxygen content is low. To produce a Cr—Si sintered body having an average crystal grain size of the $CrSi_2$ phase of 40 μm or less and an average crystal grain size of the Si phase of 30 μm or less, the particle size of the alloy powder may be preferably 1 μm or more and 300 μm or less.

The temperature of the melt in the gas atomization method is preferably the melting temperature+50° C. or higher and the melting temperature+300° C. or lower, more preferably the melting temperature+100° C. or higher and the melting temperature+250° C. or lower. The term "melting temperature" as used herein refers to a temperature at which both pure chromium and pure silicon melt. The melting temperature is usually 1,300° C. or higher and 1,500° C. or lower. If the difference between the melting temperature and the temperature of the melt is small, of the $CrSi_2$ phase and the Si phase, one crystal phase having a higher melting point is likely to precipitate previously, and it is difficult to achieve refinement of crystal grains of each phase. On the other hand, if the difference between the melting temperature and the temperature of the melt is large, alloy particles are likely to be sintered together after atomization, and alloy particles are likely to adhere to the inner wall surface of the chamber, resulting in a decrease in the recovery rate of the alloy powder.

The alloy powder obtained by the gas atomization method is preferably stored in a vacuum or an inert atmosphere. The inert atmosphere may be an inert gas such as nitrogen or argon. If the alloy powder is stored in air, the surface of the alloy powder is likely to be oxidized, and the oxygen content in the alloy powder is increased.

Regarding conditions for the arc melting method, the output of the arc is important. Whether chromium and silicon, which have a large difference in their melting points, can be alloyed depends on the output of the arc. Since the melting point of chromium is 1,863° C. and the melting point of silicon is 1,414° C., it is necessary to melt chromium and silicon with an arc current of 50 to 200 A in order to alloy chromium and silicon. If the arc current is excessively high, the amount of sublimation of chromium increases. To suppress sublimation of chromium, the arc current is preferably 50 A or more and 150 A or less.

(2) Sintering Step (Hot-Press Method)

In the sintering step, the alloy powder described above is preferably sintered in a pressure sintering furnace such as a hot-press furnace. If the alloy powder is sintered in a pressureless furnace, it is difficult to densify the Cr—Si sintered body because of a low diffusion coefficient of silicon.

The pressure (sintering pressure) applied to the alloy powder in the sintering step is preferably 50 MPa or less. If the sintering pressure exceeds 50 MPa, it is difficult to prepare a mold that can withstand the sintering pressure. When a large Cr—Si sintered body is produced, the sintering pressure is preferably 20 MPa or less, more preferably 10 MPa or less.

The temperature (sintering temperature) of the alloy powder in the sintering step is 1,100° C. or higher and 1,400° C. or lower. If the sintering temperature is lower than 1,100° C., the density of the Cr—Si sintered body is not sufficiently increased. If the sintering temperature exceeds 1,400° C., the alloy powder may melt depending on the sintering pressure. The temperature decrease rate of the Cr—Si sintered body after being heated at the above sintering temperature is not particularly limited. The temperature decrease rate can be appropriately determined in consideration of, for example, the volume of the sintering furnace, the size and shape of the Cr—Si sintered body, and the ease of cracking of the Cr—Si sintered body.

The time (sintering time) during which the sintering pressure and the sintering temperature are held at the above values is one hour or more and five hours or less. If the sintering time is less than one hour, the temperature variations are likely to occur in the sintering furnace and in the mold, and the crystalline microstructure composed of the $CrSi_2$ phase and the Si phase is unlikely to be uniformly formed in the Cr—Si sintered body. In contrast, when the sintering time is more than five hours, productivity of the Cr—Si sintered body decreases.

By controlling the sintering pressure, the sintering temperature, and the sintering time within the above ranges, a Cr—Si sintered body having a relative density of 95% or more can be produced.

The atmosphere in the sintering step is not particularly limited. To suppress oxidation of the Cr—Si sintered body, the atmosphere in the sintering step is preferably a vacuum or an inert atmosphere such as argon.

The Cr—Si sintered body produced by the method described above may be subjected to processing (such as grinding or cutting) to form a plate-like Cr—Si sintered body. Means for processing the Cr—Si sintered body may be a machining device such as a surface grinder, a cylindrical grinder, a lathe, a cutter, or a machining center.

In a method for producing a sputtering target including a Cr—Si sintered body, a Cr—Si sintered body may be joined to a backing plate or a backing tube as needed. The backing plate or the backing tube may each be composed of oxygen-free copper, titanium, or the like. The joining (bonding) between the Cr—Si sintered body and the backing plate or the backing tube may be joining with indium (In) solder or the like.

The composition of a thin film produced from a sputtering target including the Cr—Si sintered body may be substantially the same as the composition of the Cr—Si sintered body. The thin film may further contain other additive elements (such as dopants) in addition to Cr and Si.

EXAMPLES

The present invention will be described in detail by way of Examples and Comparative Examples below. The present invention is not limited by Examples below. The term "sintered body" below means a Cr—Si sintered body. The term "wt" (weight) below may also be referred to as a mass.

In Examples and Comparative Examples, the following measurements were performed.

(1) Relative Density of Sintered Body

The relative density of a sintered body was measured by the method in accordance with JIS R 1634. The bulk density d' of the sintered body was measured by the Archimedes method. The relative density of the sintered body is a value (d'/d) determined by dividing the bulk density d' of the sintered body by the true density d of the sintered body. The true density d of the sintered body is an arithmetic mean represented by mathematical expression A below. In mathematical expression A, a is a weight (unit: g) of the $CrSi_2$ phase contained in the sintered body. In mathematical expression A, b is a weight (unit: g) of the Si phase contained in the sintered body. In mathematical expression A, 4.98 is the true density (unit: $g/cm^3$) of the $CrSi_2$ phase. In mathematical expression A, 2.3 is the true density ($g/cm^3$) of the Si phase.

$$d=(a+b)/\{(a/4.98)+(b/2.3)\} \quad (A)$$

(2) Average Crystal Grain Size

<$CrSi_2$ Phase>

A backscattered electron image of a surface of a sintered body subjected to mirror polishing was taken with a scanning electron microscope. The backscattered electron image was taken at least three points in the surface of the sintered body. Grain sizes of 300 or more crystal grains of the $CrSi_2$ phase in the backscattered electron image were measured by the diameter measurement method. That is, the grain size of each of the crystal grains is an equivalent circle diameter. The average crystal grain size of the $CrSi_2$ phase was measured by the above method.

<Si Phase>

A backscattered electron image of a surface of a sintered body subjected to mirror polishing was taken with a field-emission scanning electron microscope to which a measurement device of an EBSD pattern is attached. The backscattered electron image was taken at at least three points in the surface of the sintered body. Grain sizes of 300 or more crystal grains of the Si phase in the backscattered electron image were measured by the diameter measurement method. That is, the grain size of each of the crystal grains is an equivalent circle diameter. A crystal interface where the orientation difference was 5° or more was determined as a crystal grain boundary. The average crystal grain size of the Si phase was measured by the above method.

(Conditions for Observation by Scanning Electron Microscope)

Acceleration voltage: 20 kV (3) Flexural Strength

The flexural strength of a sintered body was measured by the method in accordance with JTS R 1601.

(Measurement Conditions for Flexural Strength)

Test method: Three-point bending test
Length of support span: 30 mm
Specimen size: 3×4×40 mm
Head speed: 0.5 mm/min (4) Analysis of Oxygen Content in Sintered Body After a surface of a sintered body was ground by 1 mm or more, the oxygen content in a sample cut out from a freely chosen portion of the sintered body was measured.

Measurement Method: Impulse Furnace Fusion-Infrared Absorption Method

Apparatus: LECO TC436 Oxygen nitrogen analyzer (5) Analysis of Content of Metal Impurities in Sintered Body After a surface of a sintered body was ground by 1 mm or more, a sample was cut out from a freely chosen portion of the sintered body. The contents of elements (including impurities) in the sample were measured.

Measurement Method: Glow-Discharge Mass Spectrometry (GDMS)

(6) Sputtering Test (In the Cases of Examples 4 to 6 and Comparative Examples 1 to 3)

A circular disk was cut out from a freely chosen portion of a sintered body. The circular disk had a size of 10.16 cmϕ. A sputtering target was produced from the circular disk by indium bonding. A thin film was formed on a surface of a substrate by a sputtering test using this sputtering target. The substrate had size of 5 cm×5 cm. The presence or absence of cracks in the target after sputtering was examined. The number of particle defects (the number of particles) formed on the surface of the substrate after sputtering was counted.

Example 1

An alloy powder (raw material powder) was produced from 18 wt % of Cr flakes and 82 wt % of Si flakes by a gas atomization method. The Cr flakes had a purity of 4N (99.99 wt %). The Si flakes had a purity of 5N (99.999 wt %). In the gas atomization method, the Cr flakes and the Si flakes were melted in a carbon crucible to prepare a melt at 1,600° C. The alloy powder obtained by the gas atomization method was classified in air using a sieve to adjust the particle size of the alloy powder. The sieve had an opening size of 300 μm. That is, an alloy powder having a particle size of 300 μm or less was recovered.

The alloy powder placed in a carbon mold was sintered by a hot-press method to obtain a sintered body. The carbon mold had a size of 53 mmφ. The hot-press method was performed under the conditions below. The sintered body had a size of 53 mmφ×7 mint No microcracks were formed in the sintered body.

(Sintering Conditions)
 Sintering furnace: Hot-press furnace
 Temperature increase rate: 200° C./hour
 Temperature increase atmosphere: Vacuum (Reduced-pressure atmosphere)
 Sintering temperature: 1,300° C.
 Sintering pressure: 30 MPa
 Sintering time: 3 hours Example 2

In a gas atomization method in Example 2, an alloy powder was produced from 25 wt % of Cr flakes and 75 wt % of Si flakes. The temperature of the melt in the gas atomization method in Example 2 was 1,550° C. The sintering pressure in Example 2 was 10 MPa.

A sintered body of Example 2 was produced by the same method as in Example 1 except for the above matters. No microcracks were formed in the sintered body of Example 2.

Example 3

The sintering temperature and the sintering pressure in a hot-press method in Example 3 are shown in Table 1 below. A sintered body of Example 3 was produced by the same method as in Example 2 except for the sintering temperature and the sintering pressure. No microcracks were formed in the sintered body of Example 3.

Example 4

The sintering temperature in a hot-press method in Example 4 is shown in Table 1 below. In the hot-press method in Example 4, a sintered body was produced using a mold having a size different from that in Example 1. The sintered body of Example 4 had a size of 130 mmφ×7 mmt. The sintered body of Example 4 was produced by the same method as in Example 1 except for the above matters. No microcracks were formed in the sintered body of Example 4.

Example 5

In a hot-press method in Example 5, a sintered body was produced using a mold having a size different from that of Example 1. The sintered body of Example 5 had a size of 130 mmφ×7 mmt. The sintered body of Example 5 was produced by the same method as in Example 3 except for the above matter. No microcracks were formed in the sintered body of Example 5.

Example 6

In a hot-press method in Example 6, a sintered body was produced using a mold having a size different from that of Example 1. The sintered body of Example 6 had a size of 130 mmφ×7 mmt. In a gas atomization method in Example 6, an alloy powder was produced from 20 wt % of Cr flakes and 80 wt % of Si flakes. The sintering temperature, the sintering pressure, and the sintering time in the hot-press method in Example 6 are shown in Table 1 below.

The sintered body of Example 6 was produced by the same method as in Example 1 except for the above matters. No microcracks were formed in the sintered body of Example 6.

Comparative Example 1

In Comparative Example 1, no gas atomization method was performed. A mixture of a Cr powder and a Si powder was sintered and pulverized to produce a raw material powder of Comparative Example 1. The mixture of the Cr powder and the Si powder was sintered at 1,250° C. The Cr powder had a purity of 4N (99.99 wt %). The Si powder had a purity of 5N (99.999 wt %). After an Fe can in which the above raw material powder was placed was vacuum-degassed, the Fe can was hermetically sealed by welding. The raw material powder in the Fe can was sintered by a hot isostatic press (HIP) method to obtain a sintered body of Comparative Example 1. The sintering temperature, the sintering pressure, and the sintering time in the HIP method are shown in Table 1 below.

Comparative Example 2

In Comparative Example 2, no gas atomization method was performed. A raw material powder of Comparative Example 2 was produced by mixing a $CrSi_2$ powder and a Si powder. This raw material powder was sintered by a hot-press method to obtain a sintered body of Comparative Example 2. The Si powder had a purity of 5N (99.999 wt %). The Cr content in the raw material powder of Comparative Example 2 is shown in Table 1 below. The Si content in the raw material powder of Comparative Example 2 is shown in Table 1 below.

The sintered body of Comparative Example 2 was produced as in Example 4 except for the above matter.

Comparative Example 3

In Comparative Example 3, no gas atomization method was performed. A raw material powder of Comparative Example 3 was produced by mixing a Cr powder and a Si powder. This raw material powder was sintered by a hot-press method to obtain a sintered body of Comparative Example 3. The Cr powder had a purity of 4N (99.99 wt %). The Si powder had a purity of 5N (99.999 wt %). The Cr content in the raw material powder of Comparative Example 3 is shown in Table 1 below. The Si content in the raw material powder of Comparative Example 3 is shown in Table 1 below.

The sintered body of Comparative Example 3 was produced as in Example 4 except for the above matter.

The sintered bodies of Examples 1 to 6 and Comparative Examples 1 to 3 were each composed of a crystalline $CrSi_2$ phase and a crystalline Si phase. The content of the Si phase in each of the sintered bodies of Examples 1 to 6 and Comparative Exampled 1 to 3 is shown in Table 1 below. The summary of the methods for producing the sintered bodies of Examples 1 to 6 and Comparative Exampled 1 to 3 is shown in Table 1 below. The results of the measurements relating to the sintered bodies of Examples 1 to 6 and Comparative Exampled 1 to 3 are shown in Tables 1 and 2 below. The term "ppm" in Table 2 below means wt ppm.

TABLE 1

| Unit | Raw material powder Cr wt % | Raw material powder Si wt % | Method for producing sintered body — | Sintering step Temperature ° C. | Sintering step Pressure MPa | Sintering step Time hours | Crystal phase — | Content of Si phase wt % | Average crystal grain size CrSi$_2$ phase μm | Average crystal grain size Si phase μm | Relative density % | Flexural strength MPa | Oxygen content wt % |
|---|---|---|---|---|---|---|---|---|---|---|---|---|---|
| Example 1 | 18 | 82 | Gas atomization + Hot press | 1300 | 30 | 3 | CrSi$_2$, Si | 62.6 | 4 | 5 | 98.4 | 151 | 0.02 |
| Example 2 | 25 | 75 | Gas atomization + Hot press | 1300 | 10 | 3 | CrSi$_2$, Si | 48.7 | 4 | 4 | 99.7 | 291 | 0.02 |
| Example 3 | 25 | 75 | Gas atomization + Hot press | 1250 | 20 | 3 | CrSi$_2$, Si | 48.7 | 3 | 3 | 99.9 | 268 | 0.02 |
| Example 4 | 18 | 82 | Gas atomization + Hot press | 1275 | 30 | 3 | CrSi$_2$, Si | 62.6 | 3 | 5 | 99.9 | 283 | 0.07 |
| Example 5 | 25 | 75 | Gas atomization + Hot press | 1250 | 20 | 3 | CrSi$_2$, Si | 48.7 | 3 | 3 | 99.9 | 259 | 0.02 |
| Example 6 | 20 | 80 | Gas atomization + Hot press | 1275 | 30 | 3 | CrSi$_2$, Si | 58.5 | 3 | 3 | 99.9 | 282 | 0.02 |
| Comparative Example 1 | 18 | 82 | Pulverization + HIP method | 1250 | 100 | 1 | CrSi$_2$, Si | 62.6 | 46 | 34 | 98.1 | 58 | 1.8 |
| Comparative Example 2 | 18 | 82 | Powder mixing + Hot press | 1275 | 30 | 3 | CrSi$_2$, Si | 62.6 | 6 | 10 | 97.1 | 107 | 0.7 |
| Comparative Example 3 | 18 | 82 | Powder mixing + Hot press | 1275 | 30 | 3 | CrSi$_2$, Si | 62.6 | 4 | 42 | 96.8 | 60 | 0.5 |

TABLE 2

| Unit | Impurities Mn ppm | Impurities Fe ppm | Impurities Mg ppm | Impurities Ca ppm | Impurities Sr ppm | Impurities Ba ppm | Total ppm | Cracks after discharging | Number of particles particle |
|---|---|---|---|---|---|---|---|---|---|
| Example 1 | 0.37 | 24 | 0.74 | 2 | 0 | 0 | 27.11 | — | — |
| Example 2 | 0.41 | 27 | 0.15 | 0.59 | 0 | 0 | 28.15 | — | — |
| Example 3 | 0.29 | 19 | 0.04 | 0.45 | 0 | 0 | 19.78 | — | — |
| Example 4 | 0.33 | 25 | 1.3 | 0.99 | 0 | 0.7 | 28.32 | Not present | 21 |
| Example 5 | 0.49 | 30 | 0.03 | 0.48 | 0 | 0 | 31.00 | Not present | 8 |
| Example 6 | 0.55 | 22 | 0.05 | 0.47 | 0 | 0 | 23.07 | Not present | 17 |
| Comparative Example 1 | 0.96 | 39 | 4 | 3.3 | 0 | 0.13 | 47.39 | Present | 262 |
| Comparative Example 2 | 7.2 | 220 | 0.64 | 3.5 | 0 | 0 | 231.34 | Not present | 141 |
| Comparative Example 3 | 30 | 900 | 1.1 | 3.7 | 0 | 0.09 | 934.89 | Present | 182 |

The Cr—Si sintered bodies of Examples 1 to 6 each had better flexural strength than the Cr—Si sintered bodies of Comparative Examples 1 to 3. The Cr—Si sintered bodies of Examples 4 to 6 were each superior to the Cr—Si sintered bodies of Comparative Examples 1 to 3 in that they are less likely to crack during sputtering and that particle defects (the number of particles) in a thin film can be reduced.

INDUSTRIAL APPLICABILITY

For example, the Cr—Si sintered body according to an aspect of the present invention may be used as a material (sputtering target) for thin films included in semiconductors, solar cells, sensors for automobiles, or sensors for household electrical appliances.

The invention claimed is:
1. A Cr—Si sintered body comprising Cr and Si,
wherein the Cr—Si sintered body comprises a crystalline CrSi$_2$ phase and a crystalline Si phase,
a content of the Si phase in the Cr—Si sintered body is at least 40% by mass,
a relative density of the Cr—Si sintered body relative to a true density of the Cr—Si sintered body is at least 95%,
the CrSi$_2$ phase has an average crystal grain size of 40 μm or less,
the Si phase has an average crystal grain size of 30 μm or less,
a total content of impurities in the Cr—Si sintered body is 200 ppm by mass or less, and
the impurities are composed of at least one element selected from the group consisting of Mn, Fe, Mg, Ca, Sr, and Ba.
2. The Cr—Si sintered body according to claim 1, having a flexural strength of at least 100 MPa.
3. The Cr—Si sintered body according to claim 1, wherein an oxygen content in the Cr—Si sintered body is 1% by mass or less.
4. A sputtering target comprising the Cr—Si sintered body according to claim 1.

5. A method for producing a thin film, comprising:
forming a thin film by sputtering using the sputtering target according to claim 4.

6. The Cr—Si sintered body according to claim 2, wherein an oxygen content in the Cr—Si sintered body is 1% by mass or less.

7. A sputtering target comprising the Cr—Si sintered body according to claim 2.

8. A sputtering target comprising the Cr—Si sintered body according to claim 3.

9. A sputtering target comprising the Cr—Si sintered body according to claim 6.

10. A method for producing a thin film, comprising:
forming a thin film by sputtering using the sputtering target according to claim 7.

11. A method for producing a thin film, comprising:
forming a thin film by sputtering using the sputtering target according to claim 8.

12. A method for producing a thin film, comprising:
forming a thin film by sputtering using the sputtering target according to claim 9.

13. The Cr—Si sintered body comprising Cr and Si according to claim 1, wherein the content of the Si phase in the Cr—Si sintered body is from 40% by mass to 99% by mass.

14. The Cr—Si sintered body comprising Cr and Si according to claim 1, wherein the content of the Si phase in the Cr—Si sintered body is from 60% by mass to 99% by mass.

15. The Cr—Si sintered body comprising Cr and Si according to claim 1, wherein the content of the Si phase in the Cr—Si sintered body is from 48.7% by mass to 62.6% by mass.

16. The Cr—Si sintered body comprising Cr and Si according to claim 1, wherein the relative density of the Cr—Si sintered body relative to a true density of the Cr—Si sintered body is from 98.4% to 99.9%.

17. The Cr—Si sintered body comprising Cr and Si according to claim 1, wherein the $CrSi_2$ phase has an average crystal grain size of from 1 μm to 20 μm.

18. The Cr—Si sintered body comprising Cr and Si according to claim 1, wherein the Si phase has an average crystal grain size of from 1 μm to 20 μm.

19. The Cr—Si sintered body comprising Cr and Si according to claim 1, having a flexural strength of from 150 MPa to 500 MPa.

20. The Cr—Si sintered body comprising Cr and Si according to claim 1, wherein the oxygen content in the Cr—Si sintered body is from 0.02% by mass to 0.07% by mass.

* * * * *